United States Patent
Jiang et al.

(10) Patent No.: US 11,611,333 B1
(45) Date of Patent: Mar. 21, 2023

(54) DRIVING CIRCUIT AND A RELATED ELECTRONIC DEVICE

(71) Applicant: SHENZHEN GOODIX TECHNOLOGY CO., LTD., Guangdong (CN)

(72) Inventors: Hong Jiang, Guangdong (CN); Chang Kun Ding, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/826,110

(22) Filed: May 26, 2022

(30) Foreign Application Priority Data

Dec. 20, 2021 (CN) .......................... 202111559046.3

(51) Int. Cl.
*G06F 3/041* (2006.01)
*G06F 3/044* (2006.01)
*H03K 3/013* (2006.01)
*H03K 17/96* (2006.01)

(52) U.S. Cl.
CPC ............. *H03K 3/013* (2013.01); *G06F 3/044* (2013.01); *G06F 3/0418* (2013.01); *H03K 17/962* (2013.01)

(58) Field of Classification Search
CPC ....... G06F 3/0418; G06F 3/044; H03K 3/013; H03K 17/962
See application file for complete search history.

(56) References Cited

U.S. PATENT DOCUMENTS

| | | | |
|---|---|---|---|
| 7,151,418 B1* | 12/2006 | Chew | H03L 7/0895 331/185 |
| 2008/0042734 A1* | 2/2008 | Yu | G05F 3/262 327/538 |
| 2013/0321382 A1* | 12/2013 | Nagao | G06F 1/3262 345/212 |
| 2014/0105234 A1* | 4/2014 | Maeda | H01S 5/0428 372/38.02 |
| 2016/0004371 A1* | 1/2016 | Kim | G06F 3/0412 345/173 |
| 2018/0275804 A1* | 9/2018 | Huang | G06F 3/04184 |
| 2019/0245624 A1* | 8/2019 | Kishi | H01S 5/042 |
| 2020/0220545 A1* | 7/2020 | Chang | G06F 3/044 |

* cited by examiner

*Primary Examiner* — Hong Zhou
(74) *Attorney, Agent, or Firm* — WPAT, P.C., Intellectual Property Attorneys; Anthony King

(57) ABSTRACT

The present disclosure discloses a driving circuit and a related chip and electronic device. The driving circuit is configured to drive a load and includes: a control unit, configured to generate a first control signal and a second control signal; a first output terminal, coupled to the capacitive touch screen; a mutual capacitive driving circuit, including: a first pull-up unit, configured to selectively pull up the first output terminal coupled to a high voltage level according to the first control signal; a first pull-down unit, configured to selectively couple the first output terminal to a low voltage level according to the second control signal; a first low-pass filter circuit, coupled between the control unit and the first pull-up unit; and a second low-pass filter circuit, coupled between the control unit and the first pull-down unit.

19 Claims, 13 Drawing Sheets

DRIVING CIRCUIT AND A RELATED ELECTRONIC DEVICE

CROSS-REFERENCE TO RELATED APPLICATIONS

This application claims priority to China Application Serial Number 202111559046.3, filed on Dec. 20, 2021, which is incorporated by reference in its entirety.

TECHNICAL FIELD

The present application relates to a circuit, particularly a driving circuit and a related chip and electronic device.

BACKGROUND

When the touch control chip controls the touch screen, it will continuously send out driving signals using the switching power supply, and hence, it will generate electromagnetic interference (EMI). EMI signals have both a wide range of frequencies (from a few hundred to megahertz) and a certain amplitude, which can pollute the electromagnetic through conduction and radiation, thereby causing interference to nearby electronic equipment and potentially endangering the operator. One main conventional approach to suppress EMI is to change the device layout and product structure and to paste EMI shielding films. This conventional approach has restrictions on the use of chips and increases the design cost and development difficulty of the product.

Therefore, how to reduce EMI more efficiently has become one of the urgent issues to be solved in this field.

SUMMARY

One purpose of the present disclosure is to disclose a driving circuit and a related chip and electronic device, to address the above-mentioned issue.

One embodiment of the present disclosure discloses a driving circuit, configured to drive a load, wherein the driving circuit includes: a control unit, configured to generate a first control signal and a second control signal; a first output terminal, coupled to the capacitive touch screen; a mutual capacitive driving circuit, including: a first pull-up unit, configured to selectively couple the first output terminal to a high voltage level according to the first control signal; a first pull-down unit, configured to selectively couple the first output terminal coupled to a low voltage level according to the second control signal; a first low-pass filter circuit, coupled between the control unit and the first pull-up unit; and a second low-pass filter circuit, coupled between the control unit and the first pull-down unit.

In one optional implementation, the first pull-up unit includes a first transistor, wherein one of the source or the drain of the first transistor is coupled to the high voltage level, the other of the source or the drain of the first transistor is coupled to the first output terminal, and the gate of the first transistor is coupled to the first low-pass filter circuit.

In one optional implementation, the first transistor is a P-type transistor, wherein the source of the P-type transistor is coupled to the high voltage level, the drain of the P-type transistor is coupled to the first output terminal, and the gate of the P-type transistor is coupled to the first low-pass filter circuit.

In one optional implementation, the first pull-down unit includes a second transistor, wherein one of the source or the drain of the second transistor is coupled to the low voltage level, the other of the source or the drain of the second transistor is coupled to the first output terminal, and the gate of the second transistor is coupled to the second low-pass filter circuit.

In one optional implementation, the second transistor is an N-type transistor, wherein the source of the N-type transistor is coupled to the low voltage level, the drain of the N-type transistor is coupled to the first output terminal, and the gate of the N-type transistor is coupled to the second low-pass filter circuit.

In one optional implementation, the RC time constant of the first low-pass filter circuit and the RC time constant of the second low-pass filter circuit are both within a pre-determined range.

In one optional implementation, the pre-determined range is $10^{-10}$ to $10^{-5}$ seconds.

In one optional implementation, the first low-pass filter circuit equivalently includes:
- a first resistor unit, coupled between the control unit and the first pull-up unit; and
- a first capacitor unit, coupled between the first pull-up unit and a first reference voltage; and the second low-pass filter circuit equivalently includes:
- a second resistor unit, coupled between the control unit and the first pull-up unit; and
- a second capacitor unit, coupled between the first pull-up unit and first reference voltage.

In one optional implementation, the control unit further configured to generate third control signal, fourth control signal, fifth control signal and sixth control signal, and the driving circuit further including:
- a second output terminal, coupled to one terminal of the first capacitor;
- a third output terminal, coupled to the other terminal of the first capacitor;
- a first charge pump, configured to generate the high voltage level according to an input voltage, wherein the first charge pump includes:
  - a second pull-up unit, configured to selectively couple the second output terminal to the input voltage according to the third control signal; and
  - a second pull-down unit, configured to selectively couple the second output terminal to a first reference voltage according to the fourth control signal;
- a third low-pass filter circuit, coupled between the control unit and the second pull-up unit;
- a fourth low-pass filter circuit, coupled between the control unit and the second pull-down unit;
- a third pull-up unit, configured to selectively couple the third output terminal to the input voltage according to the fifth control signal; and
- a third pull-down unit, configured to selectively output the third output terminal as the high voltage level according to the sixth control signal;
- a fifth low-pass filter circuit, coupled between the control unit and the third pull-up unit; and
- a sixth low-pass filter circuit, coupled between the control unit and the third pull-down unit.

In one optional implementation, the control unit further configured to generate seventh control signal, eighth control signal, ninth control signal and tenth control signal, and the driving circuit further including:
- a fourth output terminal, coupled to one terminal of the second capacitor;
- a fifth output terminal, coupled to the other terminal of the second capacitor;

a second charge pump, configured to generate the low voltage level according to input voltage or the high voltage level, wherein the second charge pump includes:
  a fourth pull-up unit, configured to selectively couple the fourth output terminal to the input voltage or the high voltage level according to the seventh control signal; and
  a fourth pull-down unit, configured to selectively couple the fourth output terminal to the first reference voltage according to the eighth control signal;
a seventh low-pass filter circuit, coupled between the control unit and the fourth pull-up unit;
an eighth low-pass filter circuit, coupled between the control unit and the fourth pull-down unit;
a fifth pull-up unit, configured to selectively output the fifth output terminal as the low voltage level according to the ninth control signal; and
a fifth pull-down unit, configured to selectively couple the fifth output terminal to the first reference voltage according to the tenth control signal;
a ninth low-pass filter circuit, coupled between the control unit and the fifth pull-up unit; and
a tenth low-pass filter circuit, coupled between the control unit and the fifth pull-down unit.

In one optional implementation, the control unit further configured to generate eleventh control signal, twelfth control signal and thirteen control signal, and the driving circuit further including:
  a self-capacitive driving circuit, including:
    a sixth pull-up unit, configured to selectively couple the first output terminal to second reference voltage according to the eleventh control signal;
    a sixth pull-down unit, configured to selectively couple the first output terminal to the first reference voltage according to the twelfth control signal; an eleventh low-pass filter circuit, coupled between the control unit and the sixth pull-up unit;
    a twelfth low-pass filter circuit, coupled between the control unit and the sixth pull-down unit; and
    seventh pull-up unit, configured to selectively couple the first output terminal to a common mode voltage according to the thirteen control signal, wherein the value of the common mode voltage is an average of the first reference voltage and the second reference voltage; and
    a thirteen low-pass filter circuit, coupled between the control unit and the seventh pull-up unit.

One embodiment of the present disclosure discloses a chip, which includes the foregoing driving circuit.

One embodiment of the present disclosure discloses a electronic device, which includes the foregoing chip.

The driving circuit and the related chip and electronic device according to the present disclosure can reduce EMI from its source, thereby saving the costs for changing the device layout and product structure and pasting EMI shielding films.

DETAILED DESCRIPTION

Figure 1:
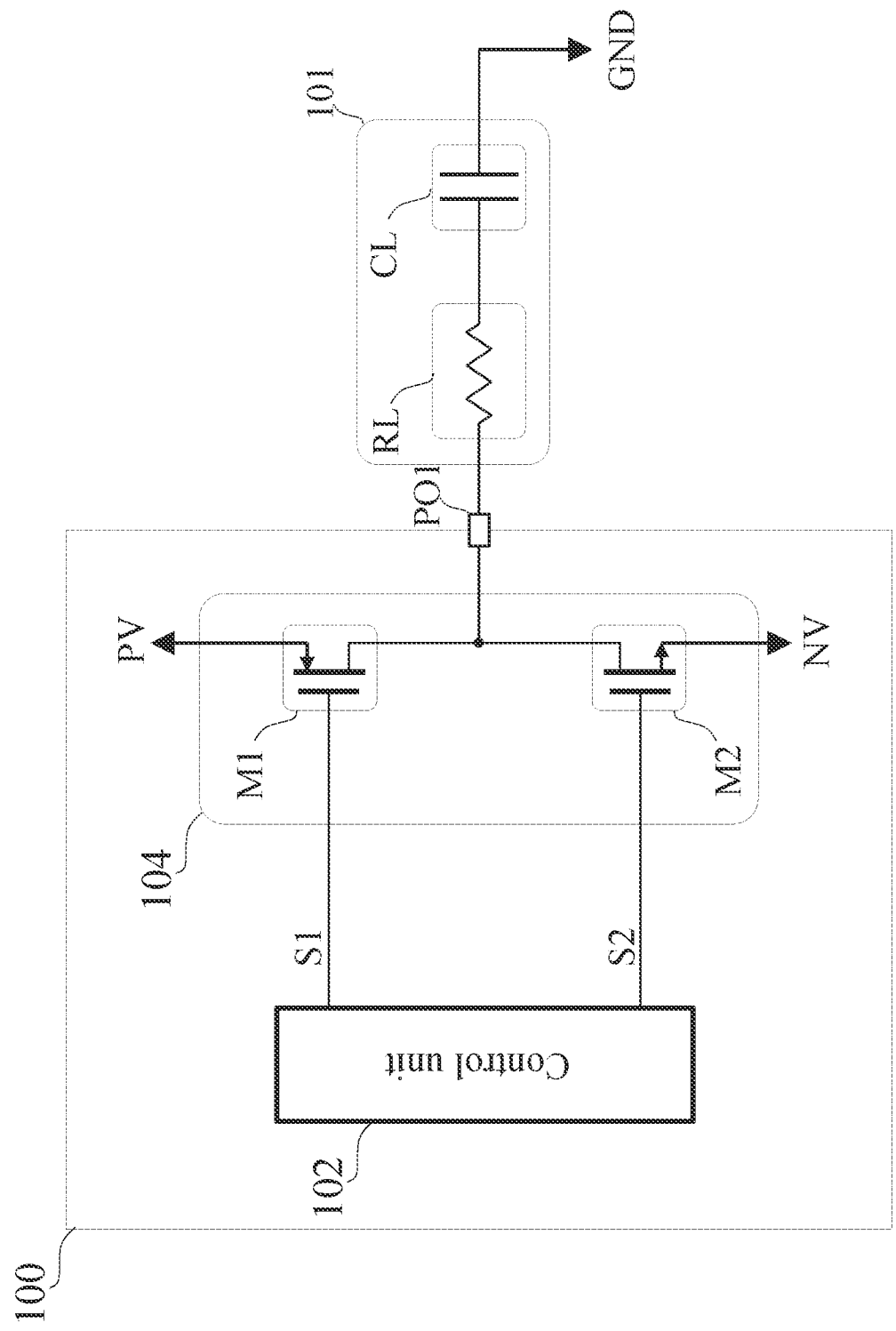
FIG. 1 is a schematic diagram of a driving circuit according to the present disclosure.

The following disclosure provides many different embodiments or examples for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various embodiments. This repetition is for the purpose of simplicity and clarity and does not in itself dictate a relationship between the various embodiments and/or configurations discussed.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. As could be appreciated, other than in the operating/working examples, or unless otherwise expressly specified, all of the numerical ranges, amounts, values, and percentages (such as those for quantities of materials, duration of times, temperatures, operating conditions, portions of amounts, and the likes)

disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Here, ranges can be expressed herein as from one endpoint to another endpoint or between two endpoints. All ranges disclosed herein are inclusive of the endpoints, unless specified otherwise.

In general, when a chip is applied to a system, the purpose is often to use the signal output from the chip to control the electronic components in the system. In this case, the electronic components can be equated to resistors and capacitors, and are considered as the load that the signal output from the chip wants to drive. Therefore the signal output from the chip needs to have sufficient driving power to bring the signal to the target voltage level. FIG. 1 is a schematic diagram of a driving circuit and its load according to the present disclosure. The driving circuit 100 is used to drive the load 101, which can be equivalently represented by the resistor RL as well as the capacitor CL in FIG. 1. In some embodiments, the load 101 may be a capacitive touch screen, so that the capacitor CL may be related to the size of the self-capacity and/or the mutual capacity of the capacitive touch screen. Details thereof will be discussed in the following relevant paragraphs with reference to FIGS. 10 to 13.

The driving circuit 100 includes a push-pull circuit 104. The push-pull circuit 104 is configured to generate a first control signal S1 and a second control signal S2 according to the control unit 102 to control the voltage level of the first output terminal PO1. The push-pull circuit 104 includes a first pull-up unit and a first pull-down unit. The first pull-up unit is configured to selectively couple the first output terminal PO1 to the high voltage level PV according to the first control signal S1. The first pull-down unit is configured to selectively couple the first output terminal PO1 to the low voltage level NV according to the second control signal S2. In the present disclosure, the first pull-up unit includes a first transistor; the first pull-down unit includes a second transistor. In FIG. 1, the first transistor is a P-type transistor M1, wherein the source of the P-type transistor M1 is coupled to the high voltage level PV, the drain of the P-type transistor M1 is coupled to the first output terminal PO1, the gate of the P-type transistor M1 is coupled to the control unit 102 to receive the first control signal S1. The second transistor is an N-type transistor M2, wherein the source of the N-type transistor M2 is coupled to the low voltage level NV, the drain of the N-type transistor M2 is coupled to the first output terminal PO1, the gate of the N-type transistor M2 is coupled to the control unit 102 to receive the second control signal S2.

When the first control signal S1 causes the P-type transistor M1 to conduct, and the second control signal S2 causes the N-type transistor M2 not to conduct, the voltage level of the first output terminal PO1 of the driving circuit 100 will be pulled up by the high voltage level PV; when the first control signal S1 causes the P-type transistor M1 not to conduct, and the second control signal S2 causes the N-type transistor M2 to conduct, the voltage level of the first output terminal PO1 of the driving circuit 100 will be pulled down by the low voltage level NV. By alternately switching in the above two states, the driving circuit 100 can cause the driving signal to periodically switch between the high voltage level PV and the low voltage level NV. In certain embodiments, in order to avoid the leakage current formed because the path between the high voltage level PV and the low voltage level NV are conducted by the P-type transistor M1 and the N-type transistor M2 at the same time, a dead zone is added between the above two states, i.e. by controlling the switching time point of the control signal S1 and the control signal S2 so that there is a short period of time between the above two states, during which both the P-type transistor M1 and the N-type transistor M2 are not conducted.

It should be noted that the implementations of the first pull-up unit and the first pull-down unit may differ from that of the push-pull circuit 104. In certain embodiments, the first pull-up unit may be formed of a plurality of first transistors connected in series and/or in parallel; the first pull-down unit may be formed of a plurality of second transistors connected in series and/or in parallel. Also, in certain embodiments, the first transistor may be implemented using an N-type transistor; the second transistor may be implemented using a P-type transistor, and the drain of the first transistor is coupled to a high voltage level PV, and the source of the first transistor is coupled to a first output terminal PO1; the drain of the second transistor is coupled to a low voltage level NV, and the source of the second transistor is coupled to a first output terminal PO1.

In the present embodiment, the driving circuit 100 is disposed on a chip, the first output terminal PO1 is the interface to the chip, and the driving signal generated by the driving circuit 100 is configured to the load 101 outside the driving chip. Since the driving signal periodically switches between the high voltage level PV and the low voltage level NV, the switching current formed during the on and off of the P-type transistor M1 and the N-type transistor M2 will cause electromagnetic interference (EMI). In general, it is necessary to reduce the electromagnetic waves released from the product by additionally adjusting the layout of the chip and load 101 and peripheral components, the overall product structure, or the EMI shielding film. In view of the foregoing, the conventional approach to suppress EMI results in certain additional cost and even makes the size and weight of the product increased. The present disclosure proposes the embodiment of FIG. 2 in order to further reduce the costs, and make the product more thin and compact.

Figure 2:
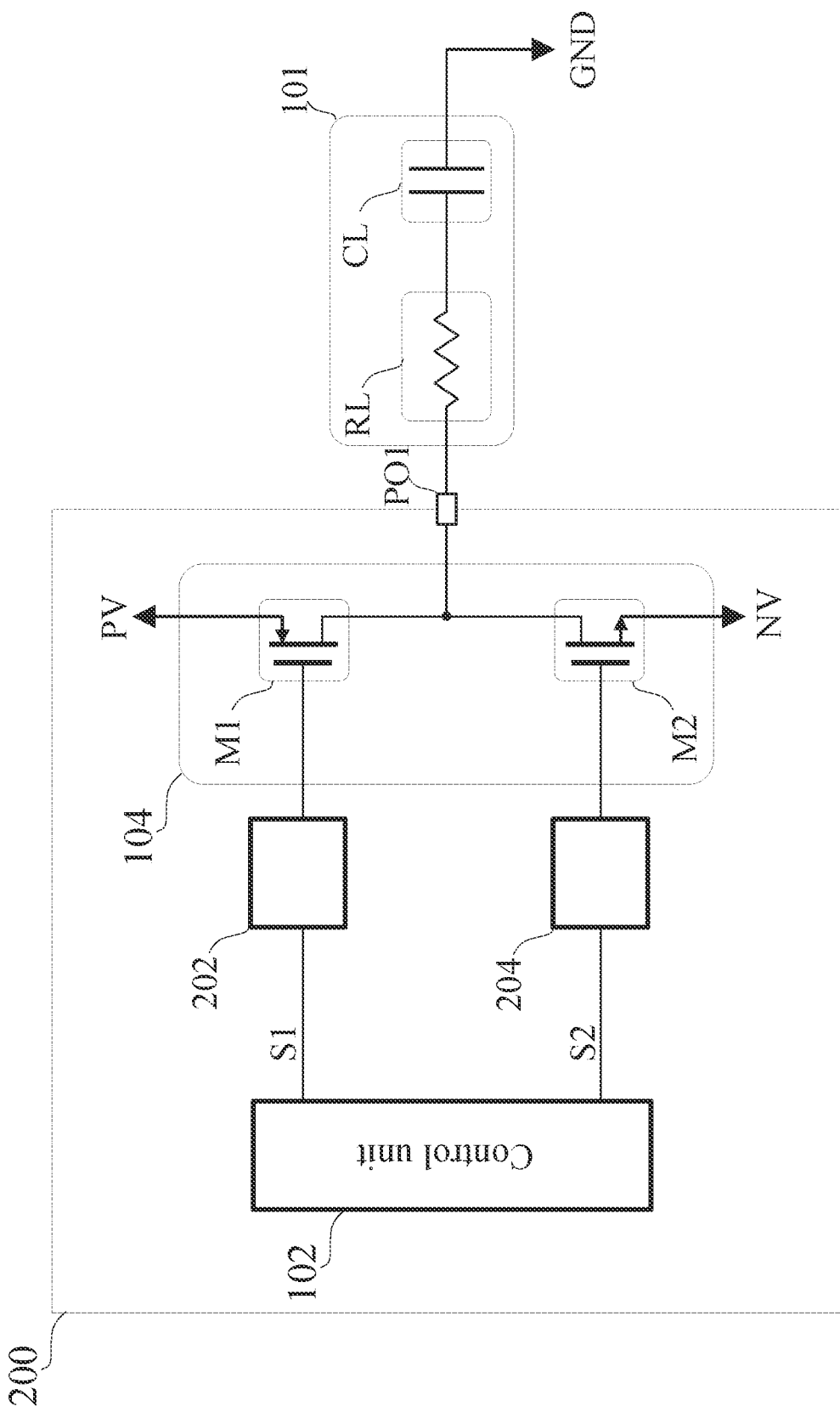
FIG. 2 is a schematic diagram of a driving circuit according to one embodiment the present disclosure.

FIG. 2 is a schematic diagram of a driving circuit according to one embodiment the present disclosure. Compared with the driving circuit 100, the driving circuit 200 of FIG. 2 has an additional low-pass filter circuit 202 and low-pass filter circuit 204. The low-pass filter circuit 202 is coupled between the control unit 102 and the first pull-up unit; that is, the low-pass filter circuit 202 is coupled between the control unit 102 and the P-type transistor M1. The low-pass filter circuit 204 is coupled between the control unit 102 and the first pull-down unit; that is, the low-pass filter circuit 204 is coupled between the control unit 102 and the N-type transistor M2.

The purpose of the low-pass filter circuit 202 and the low-pass filter circuit 204 is to limit the bandwidth of the driving circuit 200. In other words, the low-pass filter circuit 202 and the low-pass filter circuit 204 can reduce the switching speed of the P-type transistor M1 and the N-type transistor M2. Reducing the switching speed of P-type transistor M1 and the N-type transistor M2 means that the slope and burr spikes of the switching current are also limited, i.e., the high-frequency component of the switching current is suppressed. Since the EMI of the driving signal output from the drive circuit 200 is mainly generated by the switching current, the EMI of the driving signal output from the drive circuit 200 can be suppressed at the source using the low-pass filter circuit 202 and the low-pass filter circuit 204.

Figure 3:
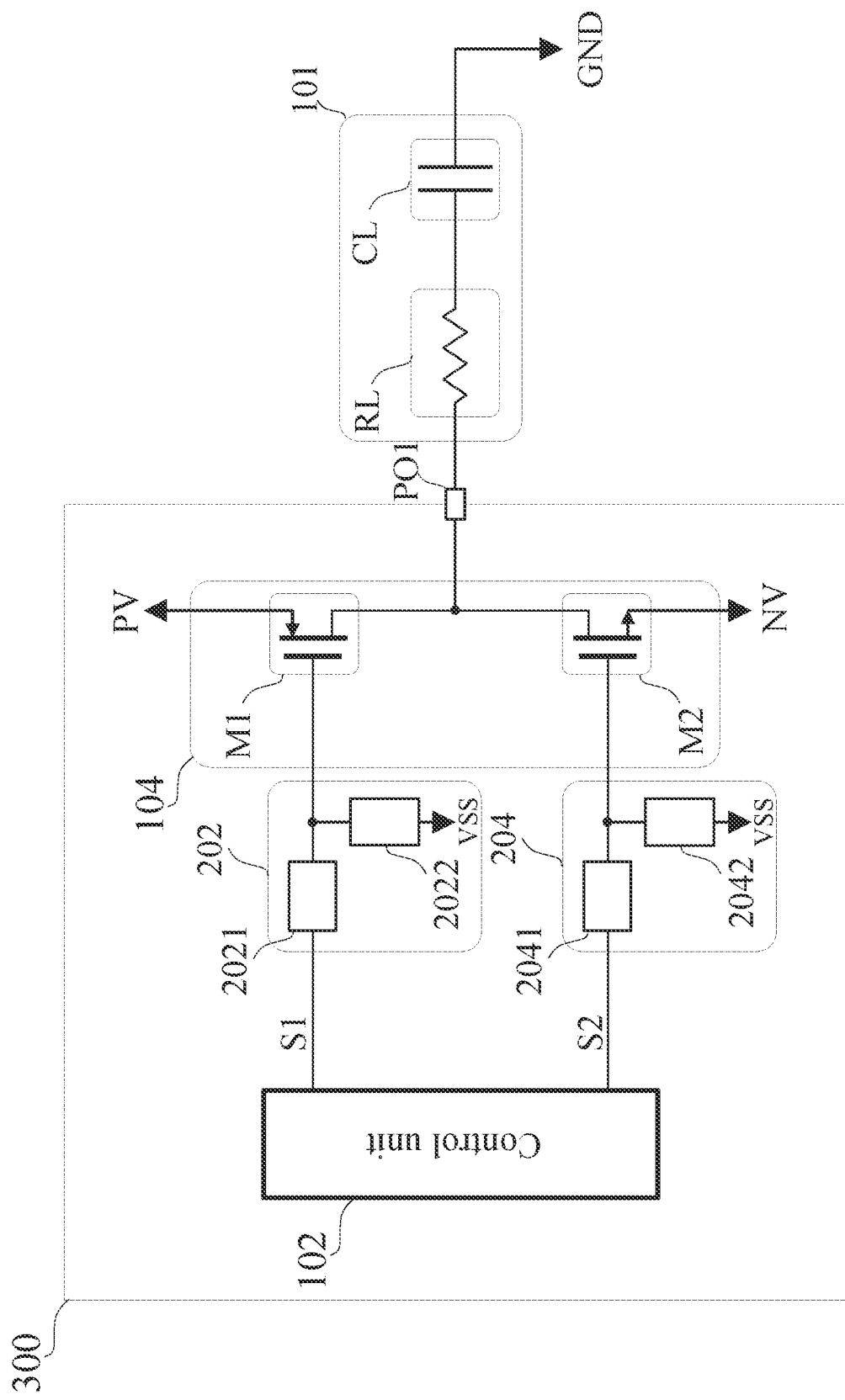
FIG. 3 is a schematic diagram of a low-pass filter circuit of a driving circuit according to one embodiment the present disclosure.

FIG. 3 is a schematic diagram of a low-pass filter circuit of a driving circuit according to one embodiment the present disclosure. The low-pass filter circuit 202 of the driving circuit 300 equivalently includes a resistor unit 2021 and a capacitor unit 2022. In this case, the resistor unit 2021 is coupled between the control unit 102 and the first pull-up unit. In the present embodiment, the resistor unit 2021 is coupled between the control unit 102 and the gate of the P-type transistor M1. The capacitor unit 2022 is coupled between the first pull-up unit and the first reference voltage VSS. In the present embodiment, the capacitor unit 2022 is coupled between the gate of the P-type transistor M1 and the first reference voltage VSS. In the present embodiment, the first reference voltage VSS is the ground voltage.

The low-pass filter circuit 204 of the driving circuit 300 equivalently includes the resistor unit 2041 and the capacitor unit 2042. In this case, the resistor unit 2041 is coupled between the control unit 102 and the first pull-down unit. In the present embodiment, the resistor unit 2041 is coupled between the control unit 102 and the gate of the N-type transistor M2. The capacitor unit 2042 is coupled between the first pull-down unit and the first reference voltage VSS. In the present embodiment, the capacitor unit 2042 is coupled between the gate of the N-type transistor M2 and the first reference voltage VSS.

Figure 4:
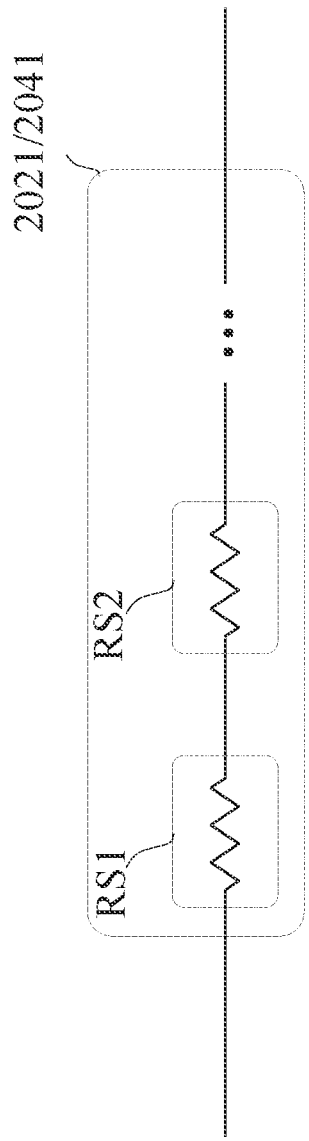
FIG. 4 is a schematic diagram of a resistor unit of a low-pass filter circuit according to one embodiment the present disclosure.
Figure 5:
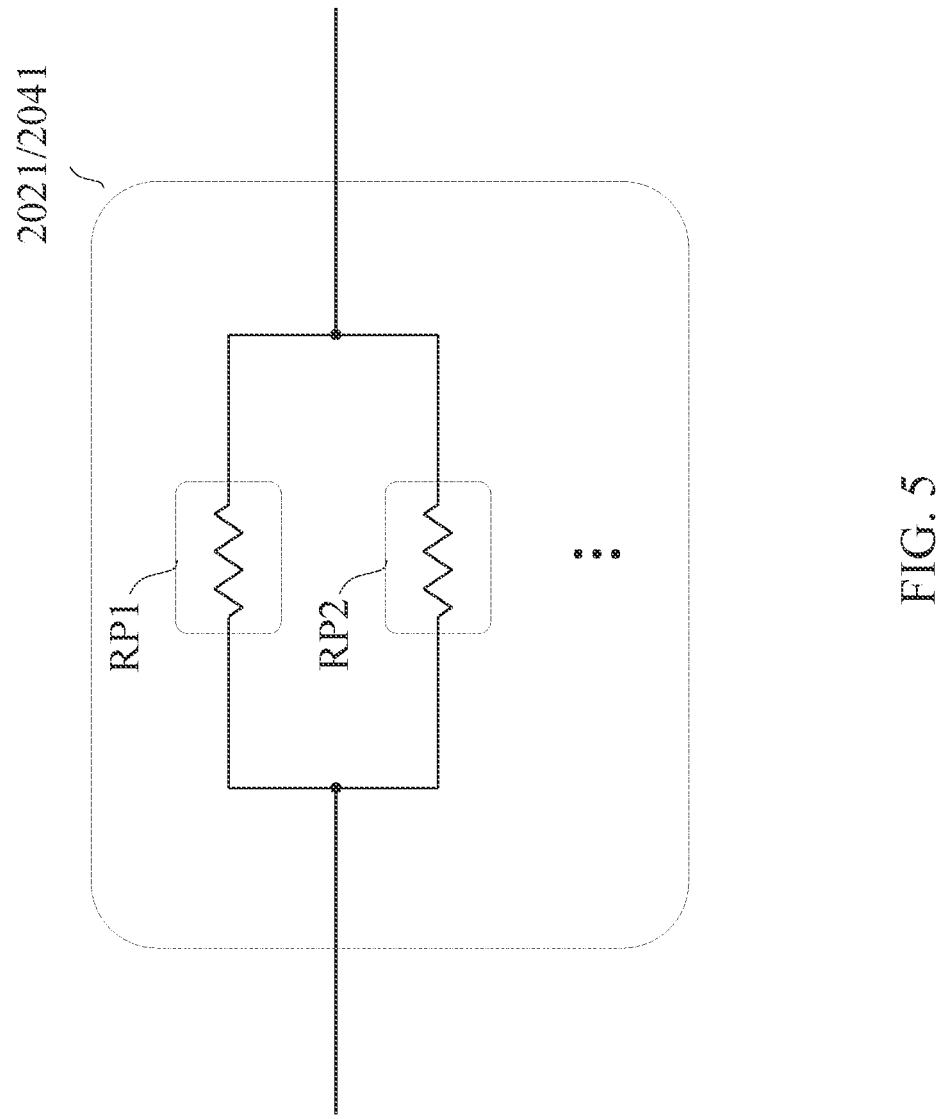
FIG. 5 is a schematic diagram of a resistor unit of a low-pass filter circuit according to another embodiment the present disclosure.
Figure 6:
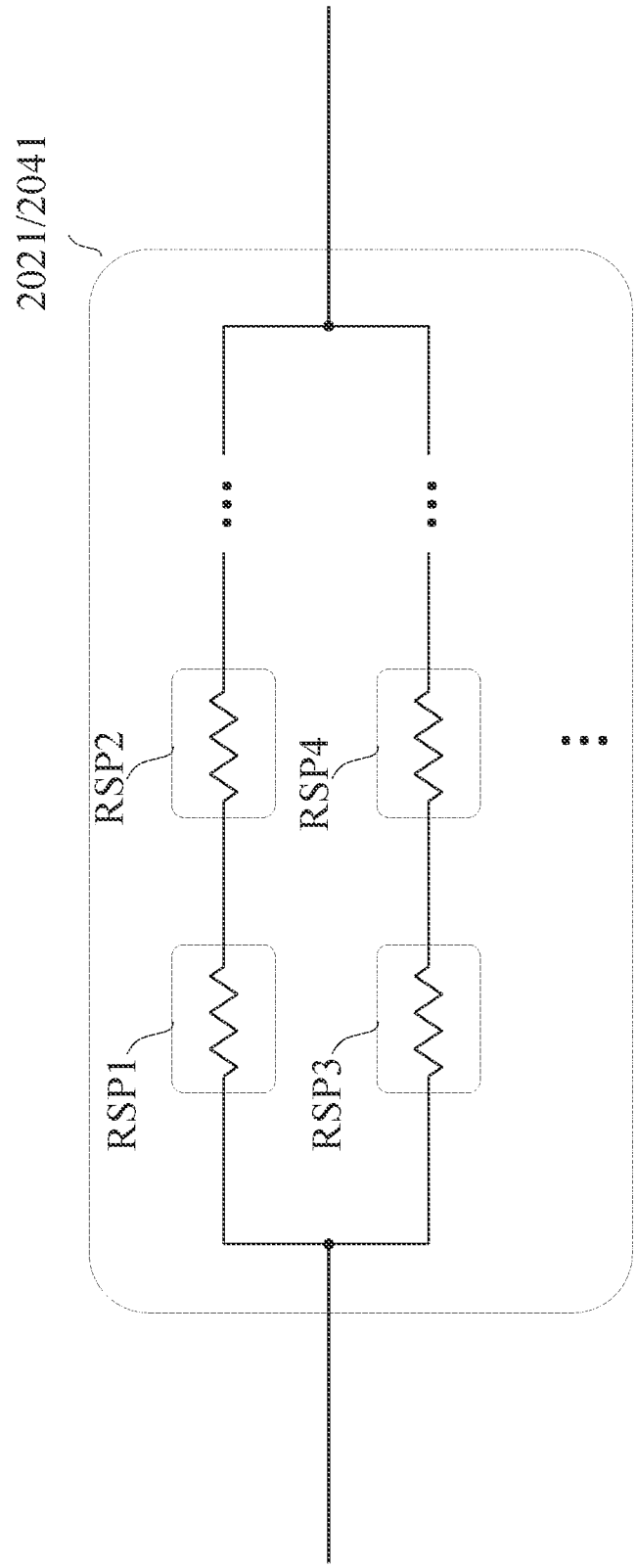
FIG. 6 is a schematic diagram of a resistor unit of a low-pass filter circuit according to yet another embodiment the present disclosure.

It should be noted that the resistor unit 2021 of the low-pass filter circuit 202 or the resistor unit 2041 of the low-pass filter circuit 204 can be implemented using a single transistor. Alternatively, they can be formed of a plurality of transistors connected in series and/or in parallel. As shown in FIG. 4, the resistor unit 2021 or the resistor unit 2041 can be formed of a plurality of transistors (i.e., transistor RS1, transistor RS2, etc.) connected in series. Alternatively, as shown in FIG. 5, the resistor unit 2021 or the resistor unit 2041 can be formed of a plurality of transistors (i.e., transistor RP1, transistor RP2, etc.) connected in parallel. Or, as shown in FIG. 6, a plurality of transistors (i.e., the transistor RSP1, the transistor RSP2, the transistor RSP3, the transistor RSP4, etc.) connected in series and in parallel can be used together to form the resistor unit 2021 or the resistor unit 2041.

Figure 7:
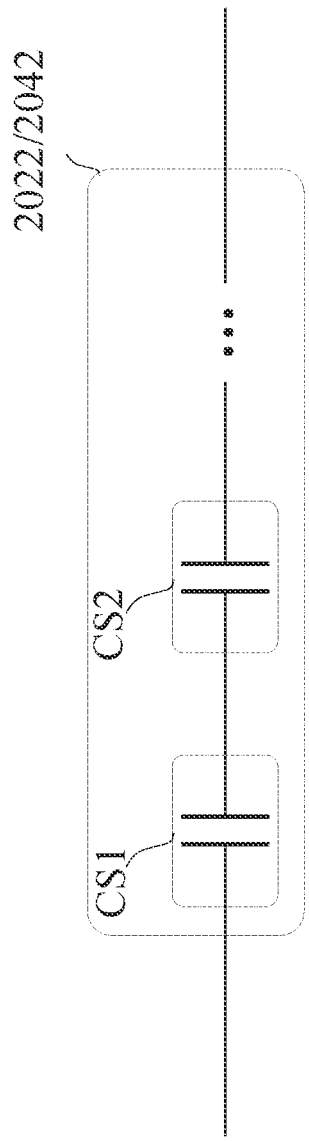
FIG. 7 is a schematic diagram of a capacitor unit of a low-pass filter circuit according to one embodiment the present disclosure.
Figure 8:
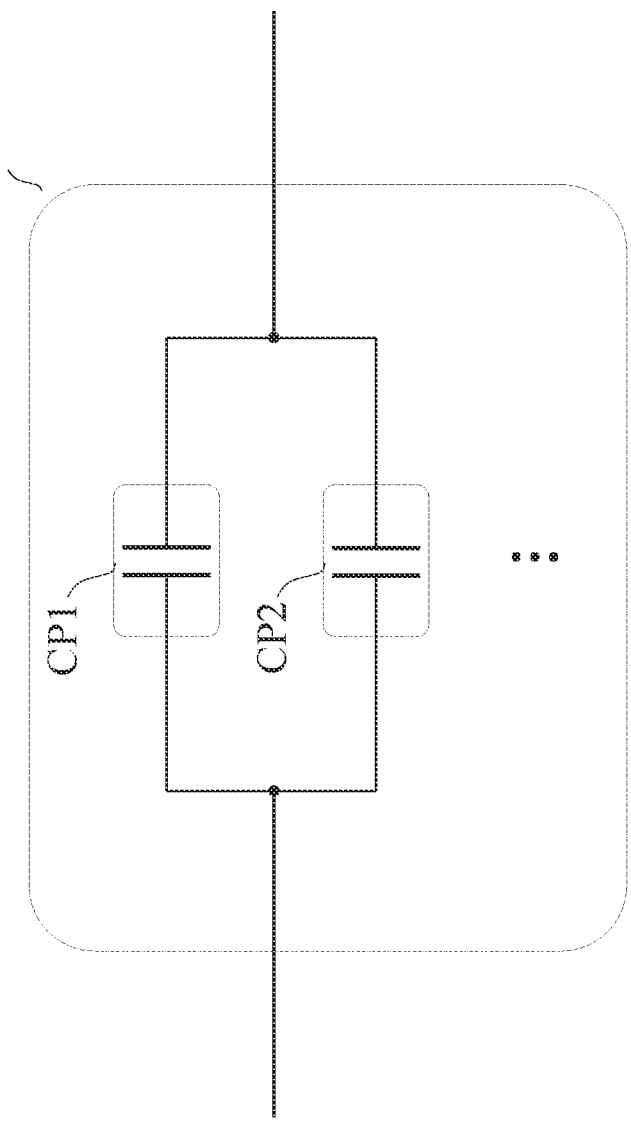
FIG. 8 is a schematic diagram of a capacitor unit of a low-pass filter circuit according to another embodiment the present disclosure.
Figure 9:
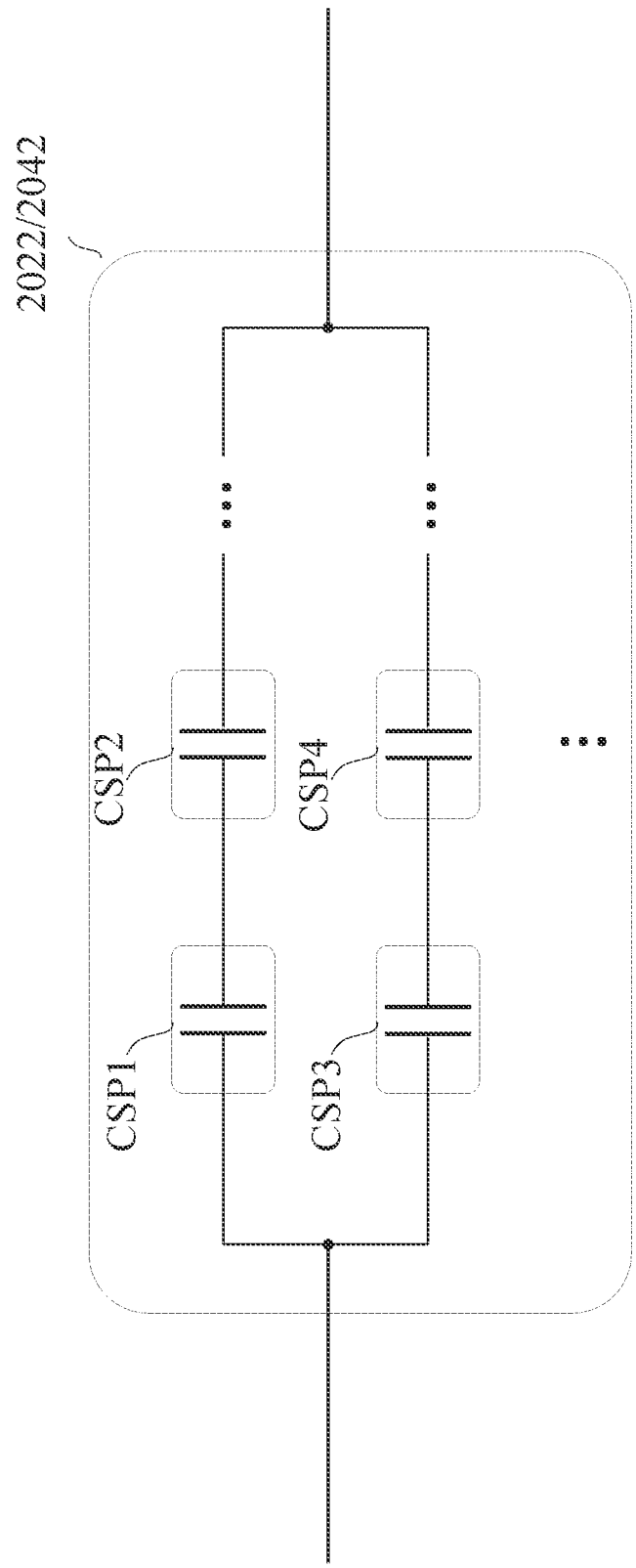
FIG. 9 is a schematic diagram of a capacitor unit of a low-pass filter circuit according to yet another embodiment the present disclosure.

Moreover, the capacitor unit 2022 of the low-pass filter circuit 202 or the capacitor unit 2042 of the low-pass filter circuit 204 can be implemented using a single capacitor. Alternatively, they can be formed of a plurality of capacitors connected in series and/or in parallel. As shown in FIG. 7, the capacitor unit 2022 or the capacitor unit 2042 can be formed of a plurality of capacitors (i.e., capacitor CS1, capacitor CS2, etc.) connected in series. Alternatively, as shown in FIG. 8, the capacitor unit 2022 or the capacitor unit 2042 can be formed of a plurality of capacitors (i.e., transistor RP1, transistor RP2, etc.) connected in parallel. Or, as shown in FIG. 9, a plurality of capacitors (i.e., the capacitor CSP1, the capacitor CSP2, the capacitor CSP3, the capacitor CSP4, etc.) connected in series and in parallel can be used together to form the capacitor unit 2022 or the capacitor unit 2042.

In the present embodiment, the RC time constant of the low-pass filter circuit 202 and the RC time constant of the low-pass filter circuit 204 can be set to both fall within a same pre-determined range, such that the high frequency components in the switching current passing through the P-type transistor M1 and the N-type transistor M2 can be suppressed equivalently. For example, the equivalent resistance value of resistor unit 2021 is the same as the equivalent resistance value of resistor unit 2041, and the equivalent capacitance value of capacitor unit 2022 is the same as the equivalent capacitance value of capacitor unit 2042.

In order to suppress EMI, the high-pass cutoff frequency of the low-pass filter circuit 202 and the low-pass filter circuit 204 should be set at a lower frequency to be more effective, but a too low high-pass cutoff frequency may not meet the demand for the operating frequency of the driving signal. Therefore, the high-pass cutoff frequency of the low-pass filter circuit 202 and the low-pass filter circuit 204 should be application-dependent. For example, in the use case where the load 101 is a capacitive touch screen, as in FIG. 10, the RC time constant of the low-pass filter circuit 202 and the RC time constant of the low-pass filter circuit 204 can be set to a pre-determined range of roughly between $10^{-10}$ and $10^{-5}$ seconds, which can effectively suppress EMI without affecting the touch performance of the capacitive touch screen.

Figure 10:
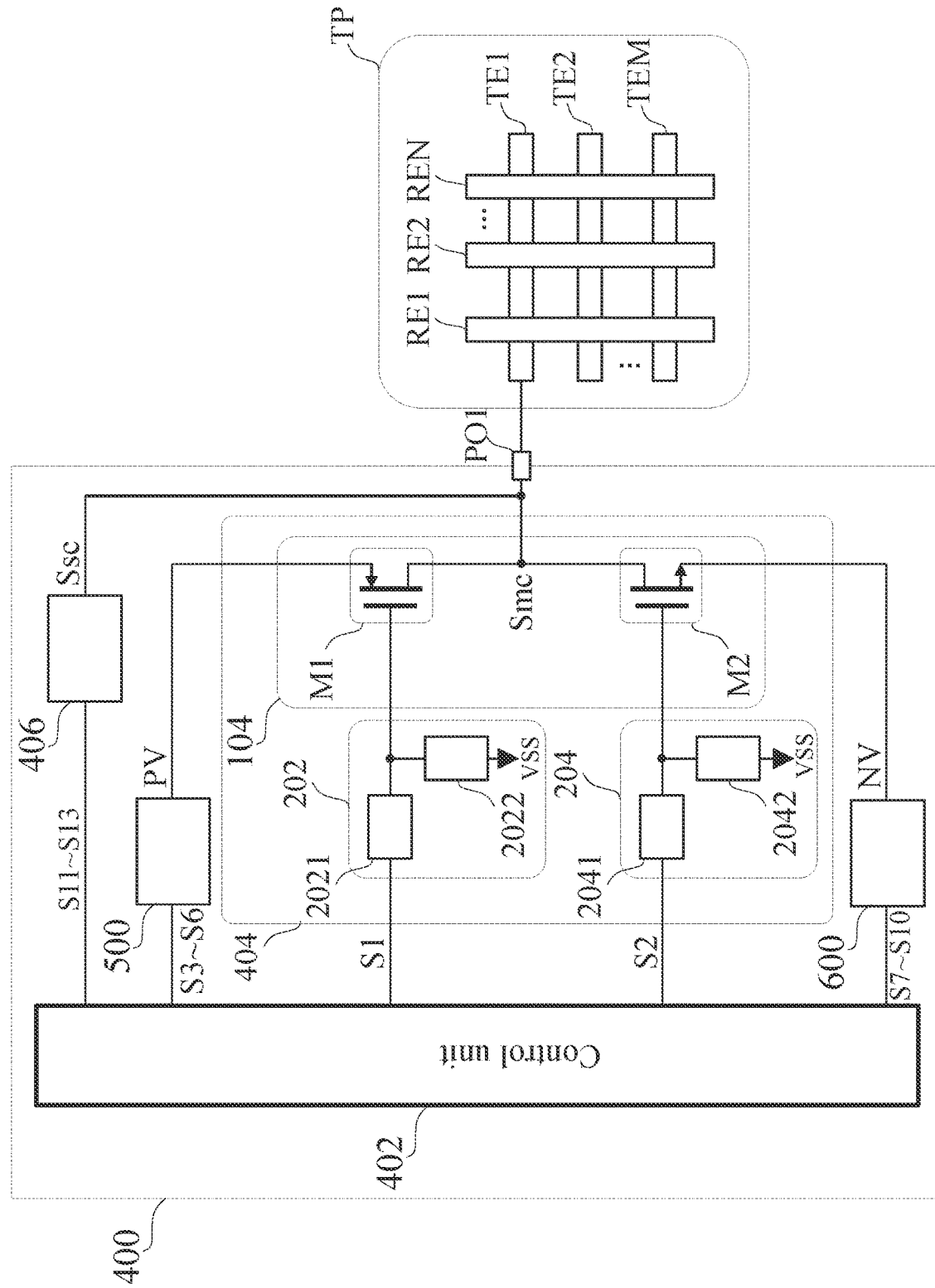
FIG. 10 is a schematic diagram of a driving circuit applied in a capacitive touch screen according to one embodiment the present disclosure.

FIG. 10 is a schematic diagram of a driving circuit applied in a capacitive touch screen according to one embodiment the present disclosure. The capacitive touch screen TP includes transmitting electrodes TE1 to TEM and receiving electrodes RE1 to REN, wherein the transmitting electrodes TE1 to TEM and the receiving electrodes RE1 to REN are vertically staggered with each other, and each receiving electrode RE1 to REN is coupled to each transmission electrode TE1 to TEM. For the sake of brevity, the driving signals and corresponding driving circuits of the remaining transmitting electrodes are not shown in the drawing.

The driving circuit 400 includes a control unit 402, a mutual capacitive driving circuit 404, a self-capacitive driving circuit 406, a first charge pump 500 and a second charge pump 600. Since the application of capacitive touch screen is more sensitive to EMI, the mutual capacitive driving circuit 404, the self-capacitive driving circuit 406, the first charge pump 500 and the second charge pump 600 all include an EMI suppression design is similar to that of the embodiment of FIG. 2 to further reduce the overall EMI of the driving circuit 400 systematically.

Specifically, the mutual capacitive driving circuit 404 is configured to generate a mutual capacitive driving signal Smc according to the first control signal S1 and the second control signal S2. The mutual capacitive driving circuit 404 includes the push-pull circuit 104, the low-pass filter circuit 202 and the low-pass filter circuit 204. The push-pull circuit 104 includes a first pull-up unit and a first pull-down unit. The first pull-up unit is configured to selectively couple the first output terminal PO1 to the high voltage level PV according to the first control signal S1. The first pull-down unit is configured to selectively couple the first output terminal PO1 to the low voltage level NV according to the second control signal S2. In the present disclosure, the first pull-up unit includes a first transistor; the first pull-down unit includes a second transistor. In FIG. 1, the first transistor is a P-type transistor M1, wherein the source of the P-type transistor M1 is coupled to the high voltage level PV, the drain of the P-type transistor M1 is coupled to the first output terminal PO1, the gate of the P-type transistor M1 is coupled to the control unit 402 to receive the first control signal S1. The second transistor is an N-type transistor M2, wherein the source of the N-type transistor M2 is coupled to the low voltage level NV, the drain of the N-type transistor M2 is coupled to the first output terminal PO1, the gate of the N-type transistor M2 is coupled to the control unit 402 to receive the second control signal S2.

The low-pass filter circuit 202 is coupled between the control unit 402 and the first pull-up unit, that is, the low-pass filter circuit 202 is coupled between the control unit 402 and the P-type transistor M1. The low-pass filter circuit 204 is coupled between the control unit 402 and the first pull-down unit; that is, the low-pass filter circuit 204 is coupled between the control unit 402 and the N-type transistor M2.

The first charge pump 500 is configured to output the high voltage level PV according to the third control signal S3, the fourth control signal S4, the fifth control signal S5 and the sixth control signal S6 generated by the control unit 402. The second charge pump 600 is configured to output the low voltage level NV according to the seventh control signal S7, the eighth control signal S8, the ninth control signal S9 and the tenth control signal S10 generated by the control unit 402. The self-capacitive driving circuit 406 is configured to generate a self-capacitive driving signal Ssc according to the eleventh control signal S11, the twelfth control signal S12 and the thirteen control signal S13.

In the present embodiment, the driving circuit 400 is disposed on a chip, the first output terminal PO1 is the interface to the chip, and the mutual capacitive driving signal Smc or the self-capacitive driving signal Ssc generated by the driving circuit 400 is output as the driving signal to drive the capacitive touch screen TP external to the chip.

Figure 11:
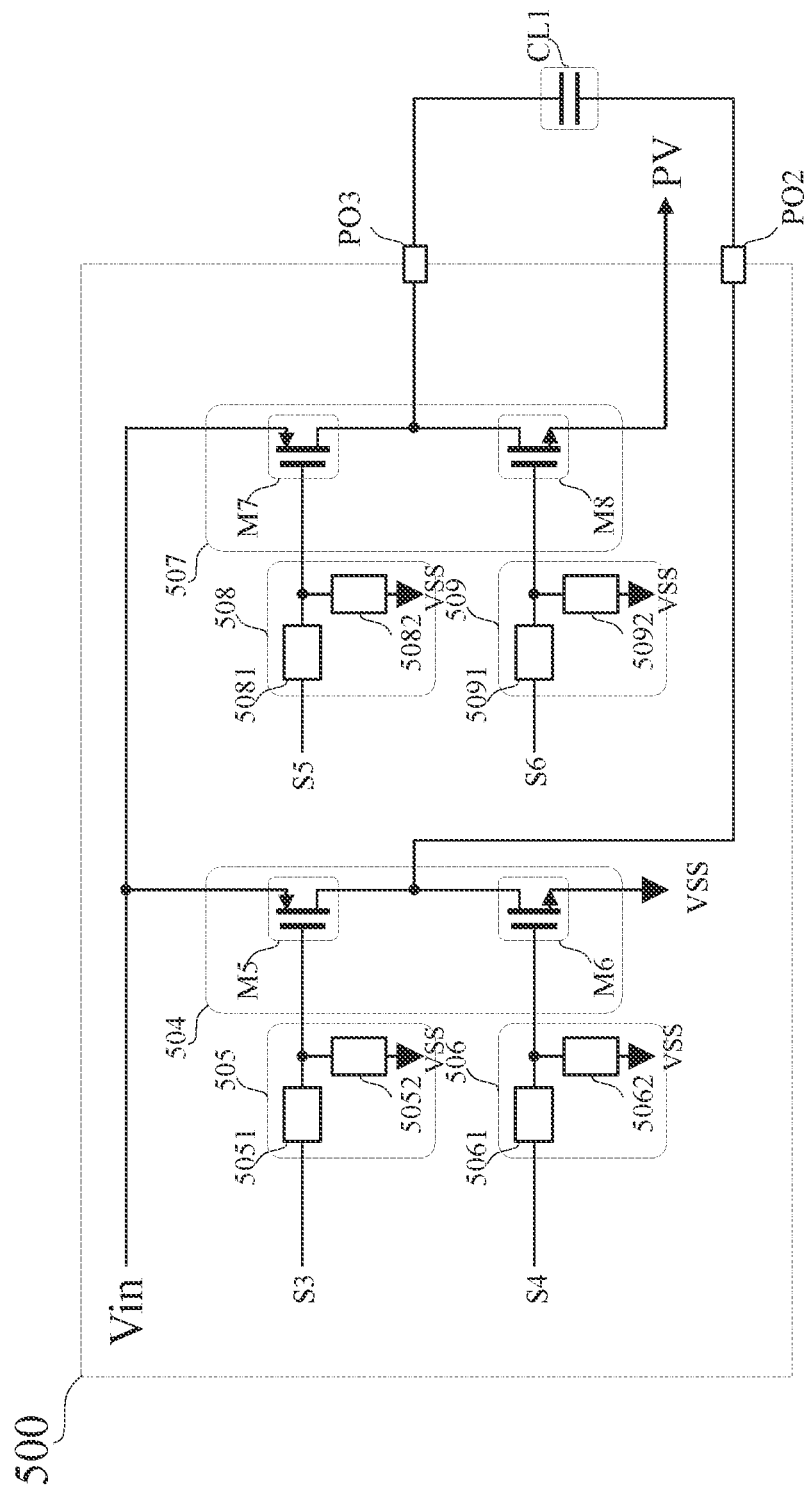
FIG. 11 is a schematic diagram of a first charge pump of a driving circuit according to one embodiment the present disclosure.

FIG. 11 is a schematic diagram of a first charge pump of a driving circuit according to one embodiment the present disclosure. The first charge pump 500 includes a push-pull circuit 504, a push-pull circuit 507, a low-pass filter circuit 505, a low-pass filter circuit 506, a low-pass filter circuit 508 and a low-pass filter circuit 509. The push-pull circuit 504 includes a second pull-up unit and a second pull-down unit. The second pull-up unit is configured to x selectively couple a second output terminal PO2 to an input voltage Vin third control signal S3. The second pull-down unit is configured to selectively couple the second output terminal PO2 to the first reference voltage VSS according to a fourth control signal S4. In the present disclosure, the second pull-up unit includes a fifth transistor; the second pull-down unit includes a sixth transistor. In FIG. 11, the fifth transistor is a P-type transistor M5, wherein the source of the P-type transistor M5 is coupled to the input voltage Vin, the drain of the P-type transistor M5 is coupled to the second output terminal PO2, the gate of the P-type transistor M5 is coupled to the control unit 402 via the low-pass filter circuit 505 to receive the third control signal S3. The sixth transistor is an N-type transistor M6, wherein the source of the N-type transistor M6 is coupled to first reference voltage Vss, the drain of the N-type transistor M6 is coupled to the second output terminal PO2, the gate of the N-type transistor M6 is 506 coupled to the control unit 402 via the low-pass filter circuit to receive fourth control signal S4.

The push-pull circuit 507 includes a third pull-up unit and a third pull-down unit. The third pull-up unit is configured to selectively couple a third output terminal PO3 to the input voltage Vin according to a fifth control signal S5. The third pull-down unit is configured to selectively output the voltage of the third output terminal PO3 as the high voltage level PV according to the sixth control signal S6. In the present disclosure, the third pull-up unit includes a seventh transistor; the third pull-down unit includes an eighth transistor. In FIG. 11, the seventh transistor is a P-type transistor M7, wherein the source of the P-type transistor M7 is coupled to the input voltage Vin, the drain of the P-type transistor M7 is coupled to the third output terminal PO3, the gate of the P-type transistor M7 is coupled to the control unit 402 via the low-pass filter circuit 508 to receive the fifth control signal S5. The eighth transistor is an N-type transistor M8, wherein the source of the N-type transistor M8 is configured to output the high voltage level PV, the drain of the N-type transistor M8 is coupled to the third output terminal PO3, the gate of the N-type transistor M8 is coupled to the control unit 402 via the low-pass filter circuit 509 to receive the sixth control signal S6.

In the present embodiment, the driving circuit 400 is disposed on a chip, and the second output terminal PO2 and the third output terminal PO3 are both the interface to the chip and respectively coupled to a first capacitor CL1 external to the chip. The first capacitor CL1 is not related to the capacitive touch screen TP, and the first capacitor CL1 and the first charge pump 500 in the present embodiment work together to perform a multiplier type DC-DC conversion to output the high voltage level PV. Since the first capacitor CL1 is generally designed to have a large capacitance value to facilitate the stable output of the first charge pump 500, the first capacitor CL1 is disposed outside the chip to reduce chip area (i.e., save cost). In this embodiment, the first capacitor CL1 is located outside the chip to reduce the chip area, i.e. to save cost. In the present embodiment, the size of the first capacitor CL1 can be between 1 nF and 10 uF. The low-pass filter circuit 505 equivalently includes a resistor unit 5051 and a capacitor unit 5052; the low-pass filter circuit 506 equivalently includes a resistor unit 5061 and a capacitor unit 5062; the low-pass filter circuit 508 equivalently includes a resistor unit 5081 and a capacitor unit 5082; the low-pass filter circuit 509 equivalently includes a resistor unit 5091 and a capacitor unit 5092. The low-pass filter circuit 505, low-pass filter circuit 506, low-pass filter circuit 508, and low-pass filter circuit 509 can effectively suppress EMI generated when the control unit 402 controls the first charge pump 500.

Figure 12:
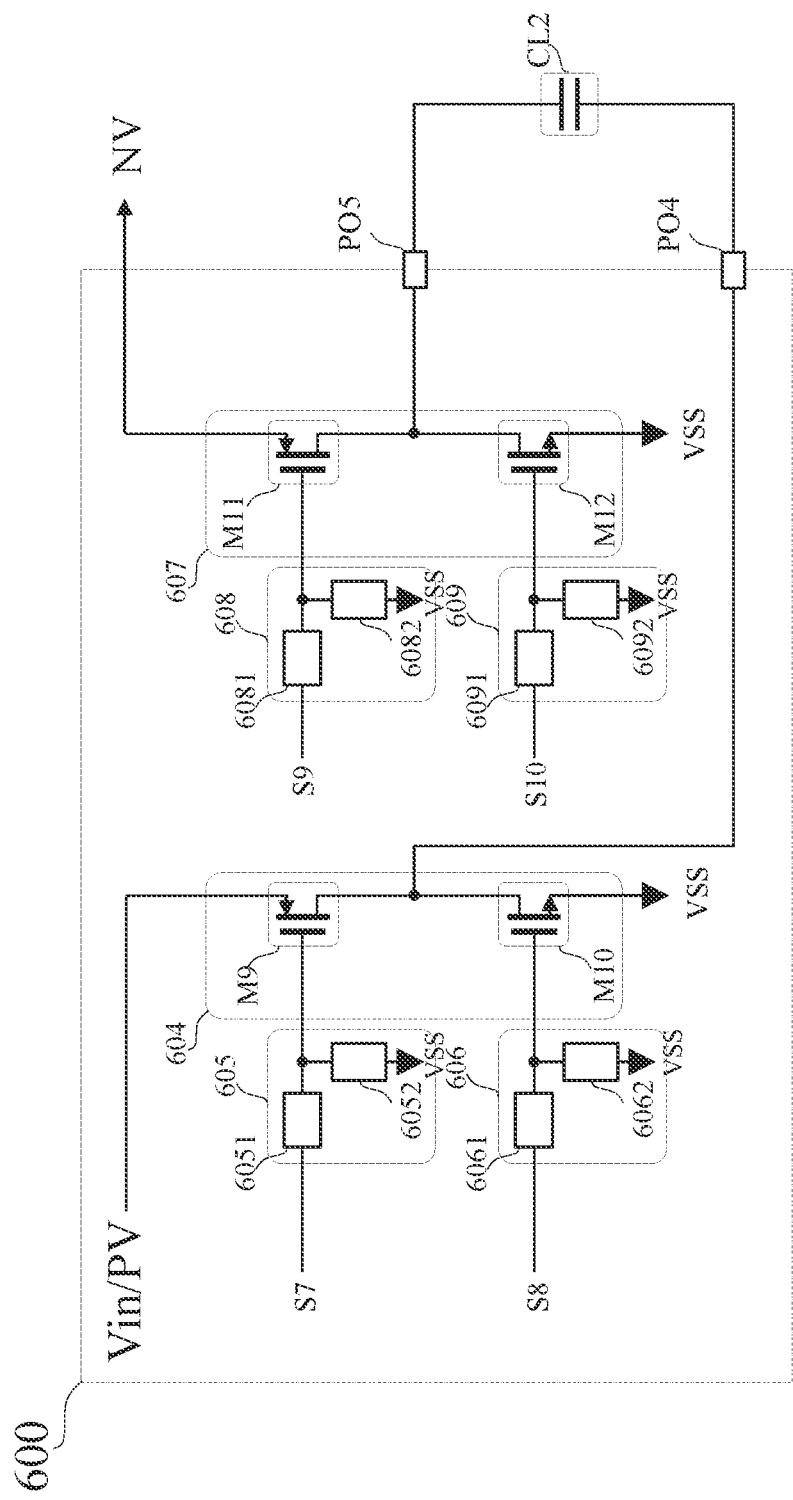
FIG. 12 is a schematic diagram of a second charge pump of a driving circuit according to one embodiment the present disclosure.

FIG. 12 is a schematic diagram of a second charge pump of a driving circuit according to one embodiment the present disclosure. The second charge pump 600 includes a push-pull circuit 604, a push-pull circuit 607, a low-pass filter circuit 605, a low-pass filter circuit 606, a low-pass filter circuit 608 and a low-pass filter circuit 609. The push-pull circuit 604 includes fa fourth pull-up unit and a fourth pull-down unit. The fourth pull-up unit is configured to selectively couple a fourth output terminal PO4 to the input voltage Vin or the high voltage level PV according to a seventh control signal S7. The fourth pull-down unit is configured to selectively couple the fourth output terminal PO4 to a first reference voltage VSS according to an eighth control signal S8. In the present disclosure, the fourth pull-up unit includes a ninth transistor; the fourth pull-down unit includes a tenth transistor. In FIG. 12, the ninth transistor is a P-type transistor M9, wherein the source of the P-type transistor M9 is coupled to the input voltage Vin or the high voltage level PV, the drain of the P-type transistor M9 is coupled to the fourth output terminal PO4, the gate of the P-type transistor M9 is coupled to the control unit 402 via the low-pass filter circuit 605 to receive the seventh control signal S7. The tenth transistor is an N-type transistor M10, wherein the source of the N-type transistor M10 is coupled to the first reference voltage Vss, the drain of the N-type transistor M10 is coupled to the fourth output terminal PO4, the gate of the N-type transistor M10 is coupled to the control unit 402 via the low-pass filter circuit 606 to receive the eighth control signal S8.

The push-pull circuit 607 includes a fifth pull-up unit and a fifth pull-down unit. The fifth pull-up unit is configured to selectively output a fifth output terminal PO5 as the low voltage level NV according to a ninth control signal S9. The fifth pull-down unit is configured to selectively couple the fifth output terminal PO5 to the input voltage Vin according to a tenth control signal S10. In the present disclosure, the fifth pull-up unit includes an eleventh transistor; the fifth pull-down unit includes a twelfth transistor. In FIG. 12, the eleventh transistor is a P-type transistor M11, wherein the source of the P-type transistor M11 is configured to output the low voltage level NV, the drain of the P-type transistor M11 is coupled to the fifth output terminal PO5, the gate of the P-type transistor M11 is coupled to the control unit 402 via the low-pass filter circuit 608 to receive the ninth control signal S9. The twelfth transistor is an N-type transistor M12, wherein the source of the N-type transistor M12 is coupled to the first reference voltage VSS, the drain of the N-type transistor M12 is coupled to the fifth output terminal PO5, the gate of the N-type transistor M12 is coupled to the control unit 402 via the low-pass filter circuit 609 to receive the tenth control signal S10.

In the present embodiment, the driving circuit 400 is disposed on a chip, and the fourth output terminal PO4 and the fifth output terminal PO5 are both the interface to the chip and respectively coupled to the second capacitor CL2 external to the chip. The second capacitor CL2 is not related to the capacitive touch screen TP, and the second capacitor CL2 and second charge pump 600 in the present embodiment work together to perform a negative voltage type DC-DC conversion to output the low voltage level NV. Since the second capacitor CL2 is generally designed to have a large capacitance value to facilitate the stable output of the second charge pump 600, the second capacitor CL2 is disposed outside the chip to reduce chip area (i.e., save cost). In the present embodiment, the size of the second capacitor CL2 can be between 1 nF and 10 uF. The low-pass filter circuit 605 equivalently includes a resistor unit 6051 and a capacitor unit 6052; the low-pass filter circuit 606 equivalently includes a resistor unit 6061 and a capacitor unit 6062; the low-pass filter circuit 608 equivalently includes a resistor unit 6081 and a capacitor unit 6082; the low-pass filter circuit 609 equivalently includes a resistor unit 6091 and a capacitor unit 6092. The low-pass filter circuit 605, low-pass filter circuit 606, low-pass filter circuit 608, and low-pass filter circuit 609 can effectively suppress EMI generated when the control unit 402 controls the second charge pump 600.

Figure 13:
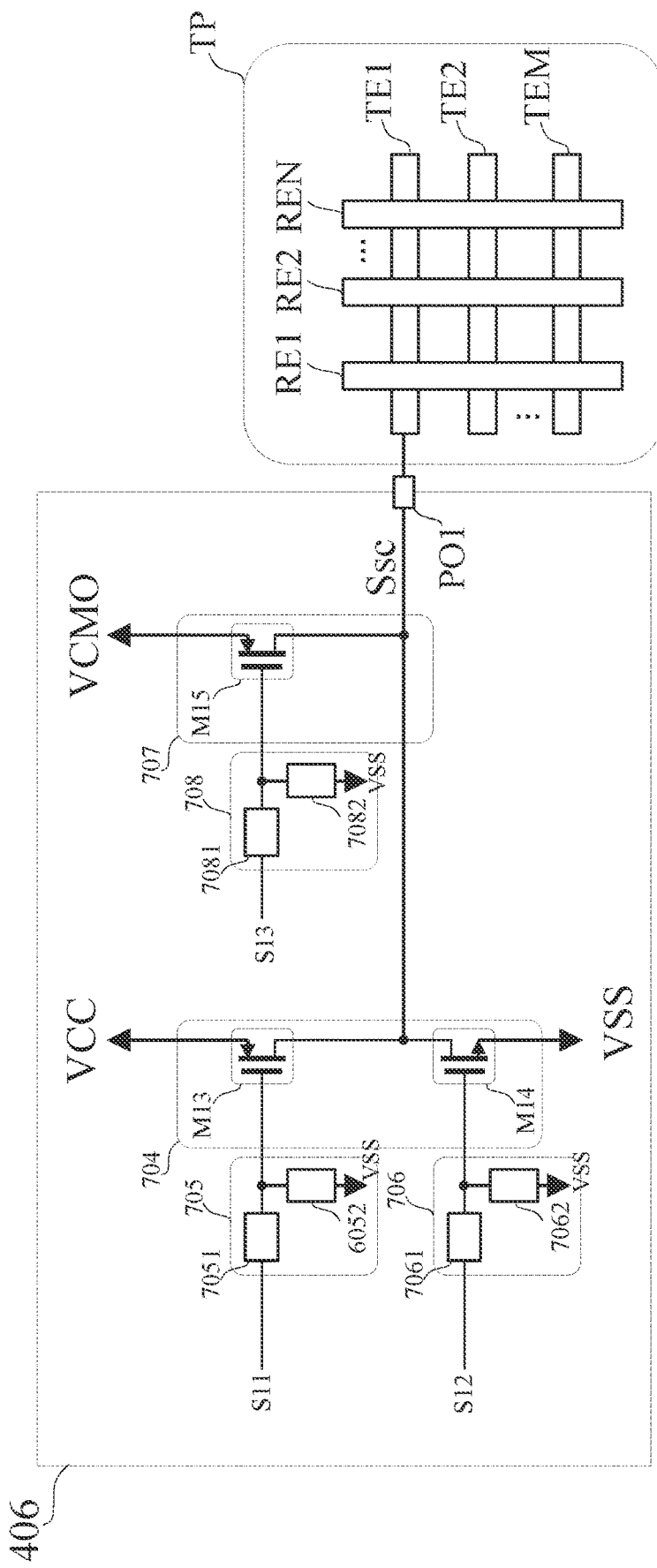
FIG. 13 is a schematic diagram of a self-capacitive driving circuit of a driving circuit according to one embodiment the present disclosure.

FIG. 13 is a schematic diagram of a self-capacitive driving circuit of a driving circuit according to one embodiment the present disclosure. Specifically, the self-capacitive driving circuit 406 is configured to generate a self-capacitive driving signal Ssc according to an eleventh control signal S11, a twelfth control signal S12 and a thirteen control signal S13. The self-capacitive driving circuit 406 includes a push-pull circuit 704, a seventh pull-up unit 707, a low-pass filter circuit 705, a low-pass filter circuit 706 and a low-pass filter circuit 708. The push-pull circuit 704 includes a sixth pull-up unit and a sixth pull-down unit. The sixth pull-up unit is configured to selectively couple the first output terminal PO1 to a second reference voltage VCC according to the eleventh control signal S11. The sixth pull-down unit is configured to selectively couple the first output terminal PO1 to a first reference voltage VSS according to the twelfth control signal S12. In the present disclosure, the sixth pull-up unit includes a thirteen transistor; the sixth pull-down unit includes a fourteenth transistor. In FIG. 13, the thirteen transistor is a P-type transistor M13, wherein the source of the P-type transistor M13 is coupled to the second reference voltage VCC, the drain of the P-type transistor M13 is coupled to the first output terminal PO1, the gate of the P-type transistor M13 is 705 coupled to the control unit 402 via the low-pass filter circuit to receive the eleventh control signal S11. The fourteenth transistor is an N-type transistor M14, wherein the source of the N-type transistor M14 is coupled to the first reference voltage VSS, the drain of the N-type transistor M14 is coupled to the first output terminal PO1, the gate of the N-type transistor M14 is coupled to the control unit 402 via the low-pass filter circuit 706 to receive the twelfth control signal S12.

The seventh pull-up unit 707 is configured to couple the first output terminal PO1 to a common mode voltage VCMO according to the thirteen control signal S13 selectively, wherein the value of the common mode voltage VCMO is an average of the first reference voltage VSS and the second reference voltage VCC. In the present disclosure, the seventh pull-up unit 707 includes a fifteenth transistor. In FIG. 13, the fifteenth transistor is a P-type transistor M15, the source of the P-type transistor M15 is coupled to the common mode voltage VCMO, the drain of the P-type transistor M15 is coupled to the first output terminal PO, the gate of the P-type transistor M15 is coupled to the control unit 402 via the low-pass filter circuit 708 to receive the thirteen control signal S13. The low-pass filter circuit 705 equivalently includes a resistor unit 7051 and a capacitor unit 7052; the low-pass filter circuit 706 equivalently includes a resistor unit 7061 and a capacitor unit 7062; the low-pass filter circuit 708 equivalently includes a resistor unit 7081 and a capacitor unit 7082. The low-pass filter circuit 705, 1 the ow-pass filter circuit 706, land the ow-pass filter circuit 708 can effectively suppress EMI generated when the control unit 402 controls the self-capacitive driving circuit 406.

The present application also presents an electronic device including a chip that drives circuits 200/300/400. Specifically, said electronic device includes, but is not limited to, mobile communication devices, ultra-mobile personal computer devices, portable entertainment devices, and other electronic devices with data interaction functions. Mobile communication devices are characterized by mobile communication functions and have the primary goal of providing voice and data communication. Such terminals include: smartphones (e.g., iPhone), multimedia phones, functional phones, and low-end cell phones. Ultra-mobile personal computer devices belong to the category of personal computers, which have computing and processing functions and generally also have mobile Internet access characteristics. Such terminals include: PDAs, MIDs and UMPC devices, such as iPads. The portable entertainment devices can display and play multimedia content. Devices in this category include: audio and video players (e.g. iPod), handheld game consoles, e-books, and smart toys and portable car navigation devices.

The foregoing outlines features of several embodiments of the present application so that persons having ordinary skill in the art may better understand the various aspects of the present disclosure. Persons having ordinary skill in the art should appreciate that they may readily use the present disclosure as a basis for designing or modifying other processes and structures for carrying out the same purposes and/or achieving the same advantages of the embodiments introduced herein. Persons having ordinary skill in the art should also realize that such equivalent constructions do not depart from the spirit and scope of the present disclosure, and that they may make various changes, substitutions, and alternations herein without departing from the spirit and scope of the present disclosure.

What is claimed is:

1. A driving circuit, configured to output a driving signal to a capacitive touch screen, wherein the driving circuit comprises:
   a control unit, configured to generate a first control signal, a second control signal, a third control signal, a fourth control signal, a fifth control signal and a sixth control signal;
   a first output terminal, coupled to the capacitive touch screen;
   a second output terminal, coupled to one terminal of a first capacitor;
   a third output terminal, coupled to the other terminal of the first capacitor;
   a mutual capacitive driving circuit, comprising:
      a first pull-up unit, configured to selectively couple the first output terminal to a high voltage level according to the first control signal;
      a first pull-down unit, configured to selectively couple the first output terminal to a low voltage level according to the second control signal;
      a first low-pass filter circuit, coupled between the control unit and the first pull-up unit; and
      a second low-pass filter circuit, coupled between the control unit and the first pull-down unit; and
   a first charge pump, configured to generate the high voltage level according to an input voltage, wherein the first charge pump comprises:
      a second pull-up unit, configured to selectively couple the second output terminal to the input voltage according to the third control signal; and
      a second pull-down unit, configured to selectively couple the second output terminal to a first reference voltage according to the fourth control signal;
      a third low-pass filter circuit, coupled between the control unit and the second pull-up unit;
      a fourth low-pass filter circuit, coupled between the control unit and the second pull-down unit;
      a third pull-up unit, configured to selectively couple the third output terminal to the input voltage according to the fifth control signal;
      a third pull-down unit, configured to selectively output the third output terminal as the high voltage level according to the sixth control signal;
      a fifth low-pass filter circuit, coupled between the control unit and the third pull-up unit; and
      a sixth low-pass filter circuit, coupled between the control unit and the third pull-down unit.

2. The driving circuit of claim 1, wherein the first pull-up unit comprises a first transistor, wherein one of the source or the drain of the first transistor is coupled to the high voltage level, the other of the source or the drain of the first transistor is coupled to the first output terminal, and the gate of the first transistor is coupled to the first low-pass filter circuit.

3. The driving circuit of claim 2, wherein the first transistor is a P-type transistor, wherein the source of the P-type transistor is coupled to the high voltage level, the drain of the P-type transistor is coupled to the first output terminal, and the gate of the P-type transistor is coupled to the first low-pass filter circuit.

4. The driving circuit of claim 1, wherein the first pull-down unit comprises a second transistor, wherein one of the source or the drain of the second transistor is coupled to the low voltage level, the other of the source or the drain of the second transistor is coupled to the first output terminal, and the gate of the second transistor is coupled to the second low-pass filter circuit.

5. The driving circuit of claim 4, wherein the second transistor is an N-type transistor, wherein the source of the N-type transistor is coupled to the low voltage level, the drain of the N-type transistor is coupled to the first output terminal, the gate of the N-type transistor is coupled to the second low-pass filter circuit.

6. The driving circuit of claim 1, wherein an RC time constant of the first low-pass filter circuit and an RC time constant of the second low-pass filter circuit are both within a pre-determined range.

7. The driving circuit of claim 6, wherein the pre-determined range is $10^{-10}$ to $10^{-5}$ seconds.

8. The driving circuit of claim 1, wherein the first low-pass filter circuit equivalently comprises:
   a first resistor unit, coupled between the control unit and the first pull-up unit; and
   a first capacitor unit, coupled between the first pull-up unit and a first reference voltage; and
   the second low-pass filter circuit equivalently comprises:
   a second resistor unit, coupled between the control unit and the first pull-down unit; and
   a second capacitor unit, coupled between the first pull-down unit and first reference voltage.

9. The driving circuit of claim 1, wherein the control unit is further configured to generate a seventh control signal, an eighth control signal, a ninth control signal and tenth control signal, and the driving circuit further comprises:
   a fourth output terminal, coupled to one terminal of a second capacitor;
   a fifth output terminal, coupled to the other terminal of the second capacitor;
   a second charge pump, configured to generate the low voltage level according to input voltage or the high voltage level, wherein the second charge pump comprises:
      a fourth pull-up unit, configured to selectively couple the fourth output terminal to the input voltage or the high voltage level according to the seventh control signal; and
      a fourth pull-down unit, configured to selectively couple the fourth output terminal to the first reference voltage according to the eighth control signal;
      a seventh low-pass filter circuit, coupled between the control unit and the fourth pull-up unit;
      an eighth low-pass filter circuit, coupled between the control unit and the fourth pull-down unit;
      a fifth pull-up unit, configured to selectively output the fifth output terminal as the low voltage level according to the ninth control signal;
      a fifth pull-down unit, configured to selectively couple the fifth output terminal to the first reference voltage according to the tenth control signal;
      a ninth low-pass filter circuit, coupled between the control unit and the fifth pull-up unit; and
      a tenth low-pass filter circuit, coupled between the control unit and the fifth pull-down unit.

10. The driving circuit of claim 1, wherein the control unit is further configured to generate an eleventh control signal, a twelfth control signal and a thirteen control signal, and the driving circuit further comprises:
   a self-capacitive driving circuit, comprising:
      a sixth pull-up unit, configured to selectively couple the first output terminal to second reference voltage according to the eleventh control signal;
      a sixth pull-down unit, configured to selectively couple the first output terminal to the first reference voltage according to the twelfth control signal;

an eleventh low-pass filter circuit, coupled between the control unit and the sixth pull-up unit;
a twelfth low-pass filter circuit, coupled between the control unit and the sixth pull-down unit;
seventh pull-up unit, configured to selectively couple the first output terminal to a common mode voltage according to the thirteen control signal, wherein the value of the common mode voltage is an average of the first reference voltage and the second reference voltage; and
a thirteen low-pass filter circuit, coupled between the control unit and the seventh pull-up unit.

11. A chip, comprising:
a driving circuit, wherein the driving circuit configured to output a driving signal to a capacitive touch screen, wherein the driving circuit comprises:
  a control unit, configured to generate a first control signal, a second control signal, a third control signal, a fourth control signal, a fifth control signal and a sixth control signal;
  a first output terminal, coupled to the capacitive touch screen;
  a second output terminal, coupled to one terminal of a first capacitor;
  a third output terminal, coupled to the other terminal of the first capacitor;
  a mutual capacitive driving circuit, comprising:
    a first pull-up unit, configured to selectively couple the first output terminal to a high voltage level according to the first control signal;
    a first pull-down unit, configured to selectively couple the first output terminal to a low voltage level according to the second control signal;
    a first low-pass filter circuit, coupled between the control unit and the first pull-up unit; and
    a second low-pass filter circuit, coupled between the control unit and the first pull-down unit; and
  a first charge pump, configured to generate the high voltage level according to an input voltage, wherein the first charge pump comprises:
    a second pull-up unit, configured to selectively couple the second output terminal to the input voltage according to the third control signal; and
    a second pull-down unit, configured to selectively couple the second output terminal to a first reference voltage according to the fourth control signal;
    a third low-pass filter circuit, coupled between the control unit and the second pull-up unit;
    a fourth low-pass filter circuit, coupled between the control unit and the second pull-down unit;
    a third pull-up unit, configured to selectively couple the third output terminal to the input voltage according to the fifth control signal;
    a third pull-down unit, configured to selectively output the third output terminal as the high voltage level according to the sixth control signal;
    a fifth low-pass filter circuit, coupled between the control unit and the third pull-up unit; and
    a sixth low-pass filter circuit, coupled between the control unit and the third pull-down unit.

12. The chip of claim 11, wherein the first pull-up unit comprises a first transistor, wherein one of the source or the drain of the first transistor is coupled to the high voltage level, the other of the source or the drain of the first transistor is coupled to the first output terminal, and the gate of the first transistor is coupled to the first low-pass filter circuit.

13. The chip of claim 12, wherein the first transistor is a P-type transistor, wherein the source of the P-type transistor is coupled to the high voltage level, the drain of the P-type transistor is coupled to the first output terminal, and the gate of the P-type transistor is coupled to the first low-pass filter circuit.

14. The chip of claim 11, wherein the first pull-down unit comprises a second transistor, wherein one of the source or the drain of the second transistor is coupled to the low voltage level, the other of the source or the drain of the second transistor is coupled to the first output terminal, and the gate of the second transistor is coupled to the second low-pass filter circuit.

15. The chip of claim 14, wherein the second transistor is an N-type transistor, wherein the source of the N-type transistor is coupled to the low voltage level, the drain of the N-type transistor is coupled to the first output terminal, the gate of the N-type transistor is coupled to the second low-pass filter circuit.

16. The chip of claim 11, wherein an RC time constant of the first low-pass filter circuit and an RC time constant of the second low-pass filter circuit are both within a pre-determined range.

17. An electronic device, comprising:
a chip according to claim 11;
the capacitive touch screen, disposed externally to the chip; and
the first capacitor, disposed externally to the chip.

18. The electronic device of claim 17, wherein the chip is a touch screen driving chip.

19. The electronic device of claim 18, wherein the first output terminal outputs the driving signal to the capacitive touch screen.

* * * * *